United States Patent [19]
Amin

[11] Patent Number: 5,172,341
[45] Date of Patent: Dec. 15, 1992

[54] SERIAL DRAM CONTROLLER WITH MULTI GENERATION INTERFACE

[75] Inventor: Pravin T. Amin, Plano, Tex.

[73] Assignee: Dallas Semiconductor Corporation, Dallas, Tex.

[21] Appl. No.: 730,412

[22] Filed: Jul. 16, 1991

Related U.S. Application Data

[63] Continuation of Ser. No. 471,208, Jan. 19, 1990.

[51] Int. Cl.[5] ...................... G11C 13/00; G11C 11/40
[52] U.S. Cl. .................................. 365/222; 365/233
[58] Field of Search ............ 365/182, 222, 233, 189.01

[56] References Cited

U.S. PATENT DOCUMENTS 3,737,879  6/1973  Greene et al. .................. 365/222
5,033,027  7/1991  Amin ............................. 365/222

*Primary Examiner*—Terrell W. Fears

[57] ABSTRACT

A DRAM controller which can be directly connected, without any automatic or selected reconfiguration, to DRAMs of various sizes. The externally-received address bits are remapped, so that the most significant two bits of the externally-received address bits are remapped onto the most significant bit of a row address and the most significant bit of a column address. This controller also provides selectable refresh periods.

1 Claim, 3 Drawing Sheets

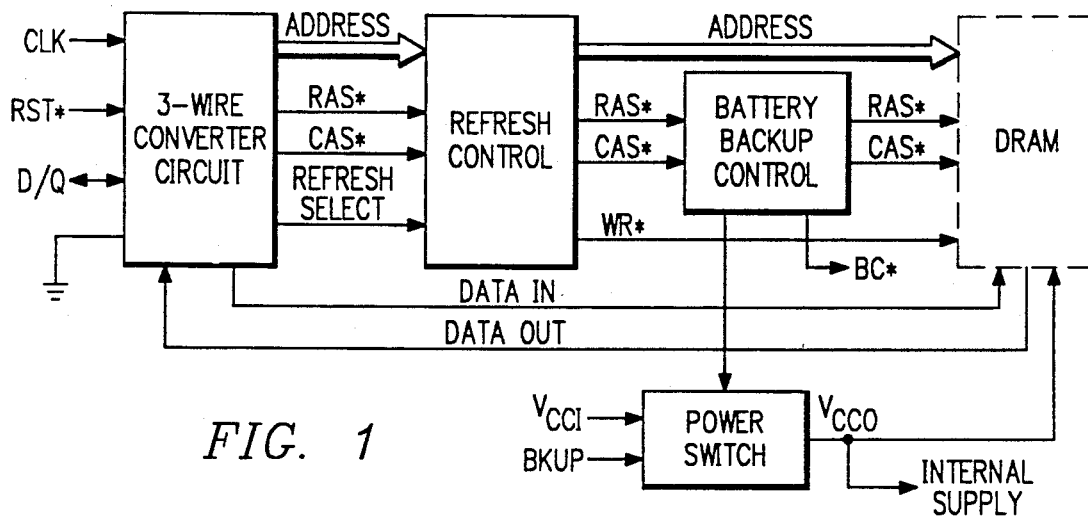
FIG. 1
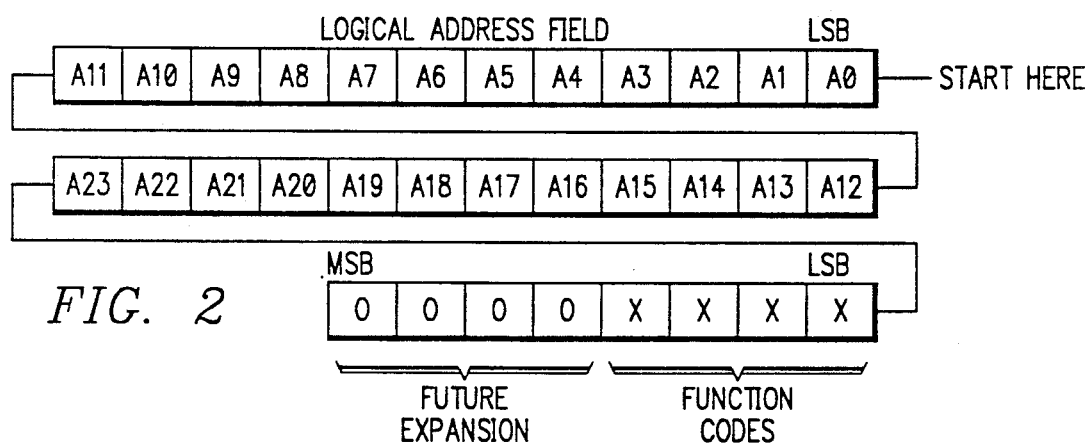
FIG. 2
FIG. 4
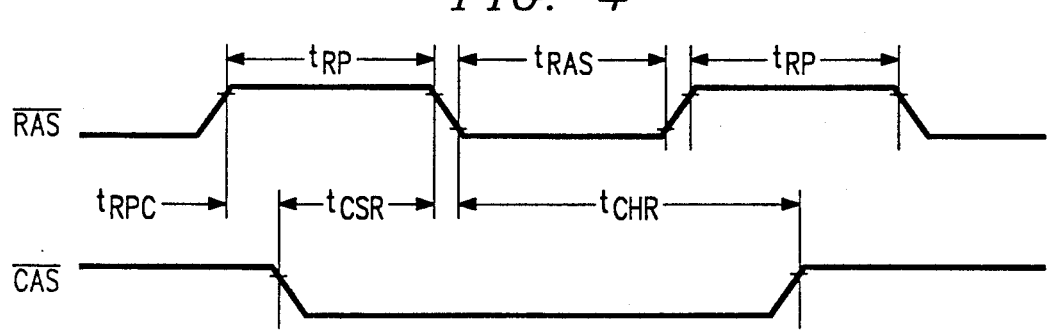

28-PIN DIP

SERIAL DRAM CONTROLLER WITH MULTI GENERATION INTERFACE

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO OTHER APPLICATIONS

The following application of common assignee contains related subject matter, and is believed to have an effective filing date identical with that of the present application: Serial No. 471,208, filed Jan. 19, 1990, entitled "SERIAL DRAM CONTROLLER WITH TRANSPARENT REFRESH" (2846-165); which is hereby incorporated by reference.

BACKGROUND AND SUMMARY OF THE INVENTION

The present invention relates to controllers for dynamic memories, and particularly to integrated circuits which control DRAM memory.

The disclosed preferred embodiments provide a DRAM controller which
- "serializes" and
- "nonvolatizes" a bank of DRAMs, while
- providing multi-generation flexibility,
- providing refresh control which is totally transparent to the system, and
- providing various overhead management functions.

To appreciate the interrelation and desirability of these features, and the specific innovative implementations used to achieve them, various general aspects of the DRAM art will first be reviewed.

DRAMs from the System Designer's Point of View

DRAMs are the lowest-cost type of semiconductor memory. DRAMs are therefore used in a very wide variety of computer systems, and in other electronic systems as well.

Refreshing Requirements

DRAM memories require refreshing. In a DRAM, information is represented by the presence or absence of electric charge in storage capacitors in the DRAM cell. (For example, a "1" might be written into a DRAM cell by storing a packet of charge in the cell, and a "0" by not storing a packet of charge.) However, these packets of charge are very small, and they rapidly leak away. Depending on various factors, the data stored in a DRAM cell may become unreadable within less than 1/10th of a second after it has been written.

Therefore, to maintain stable storage of data, it is necessary to periodically read out each of the cells in the chip, amplify the data signal from the cell, and write the amplified data signal back into the cell. This function is well known to those skilled in the art of computer memory system design. Many chips are available to perform "memory management" functions, such as determining when another refresh cycle must be initiated for the DRAM chips in a memory bank.

Unless a DRAM receives refresh signals and power, the stored data will be lost. Therefore, the data in a conventional memory bank composed of DRAMs will disappear whenever a significant power interruption occurs. It would be highly desirable to avoid this vulnerability to power interruption, but no commercially feasible way to accomplish this has yet been presented.

Control of DRAM Refresh Timing

The need for refreshing, which is dictated by the inherent structure of DRAM memory cells, implies some inherent conflict: DRAMs must be refreshed periodically, but the refreshing operations should preferably interfere with memory access as little as possible.

The computer system which attempts to access the data in DRAMs will typically not know what the refresh status of the DRAM chips is. Therefore, if the system attempts to access the chip during a refresh cycle, the system may be told to wait (that is, a "wait state" is generated). This is inefficient.

The timing of refresh cycles is somewhat flexible, and therefore the designers of DRAM control circuits have tried, in various ways, to perform the refresh cycles during periods when memory access is not occuring. Still, there is some inherent conflict. One approach to this is shown in U.S. Pat. No. 4,028,675 to Frankenberg (which is hereby incorporated by reference), which appears to suggest a sort of arbitration scheme, in which wait states may still sometimes be generated.

Variable DRAM Refresh Timing

Another advantageous teaching provided by the DRAM controller of the present invention is selectable refresh periods. (For example, in the presently preferred embodiment, the controller chip can be programmed to refresh the DRAM chip(s) at intervals of as little as 4 ms, or as long as 32 ms.) This capability can be used by systems integrators in at least two ways: first, the controller can be programmed to match the characteristics of whatever DRAM memories are actually used in the finished system. Thus, in power-critical applications, DRAM chips with tighter specifications on refresh timing can be used, while in other applications, cheaper DRAM chips can be used, and the controller can be programmed to optimally match the characteristics of whichever type are used.

In applications where power conservation is critical, the refresh rate provided by the DRAM controller of the presently preferred embodiment can be adjusted dynamically on the fly, to optimize refresh cycle timing for the actual data retention times of the memories being used at a particular moment. For example, this capability can be used to provide temperature-dependent variable refresh intervals in a low power system using DRAMs.

The controller chip of the presently preferred embodiment also includes control options which permit it to work with DRAM chips which have a wide variety of speeds. Thus, this controller can be used in combination with extremely cheap memory chips, to provide low-cost bulk solid state memory, without being limited to low-speed memory operation.

Interfacing to Multiple Generations of DRAMs

The rapid evolution of DRAMs is advantageous to users, but can be somewhat inconvenient in designing a system architecture. DRAM densities advance by one full generation about every 3 years. Thus, for example, the 16K DRAMs which were commercially dominant in the late 1970s were successively superseded, over the next decade, by 64K, 256K, and 1M DRAMs. Since the lifetime of a computer system architecture can be significantly longer than that of a DRAM generation, the system architecture should be able to interface to new generations, or the architecture will become obsolete for that reason alone. Moreover, at any one time, 2 or 3 different densities will be prevalent in the marketplace, since users will make their own choices in view of cost per bit, system costs, speed, reliability, physical density, power dissipation, etc.

Thus, it is highly desirable for the computer system architecture to be able to be used with more than one density of DRAM. However, there are some difficulties in achieving this. Some discussion of the problems of multigeneration DRAM adaptability may be found in U.S. Pat. No. 4,675,808 ("Multiplexed-address interface for addressing memories of various sizes"-Grinn et. al.).

Note that conventional addressing architectures pose some degree of incompatibility among different generations of memories. For example, in a normal 1M DRAM, the 20 address bits 0 through A19 would typically be allocated with bits A0 through A9 (for example) used for the column address, and bits A10 through A19 used for the row address. Thus, A9 is the most significant bit of the column address, and A19 is the most significant bit of the row address. If the address field is expanded by two bits (to scale to a four megabit RAM), using the same allocation of the logical address field, A10 would now be the most significant column address bit, rather than the least significant row address bit, and A22 would be the most significant row address bit. Thus, straightforward expansion would interfere with the sequencing nodes normally used to implement the refresh timing or serial access operations. Therefore, to provide multigeneration compatibility, the DRAM controller of the present inventions remaps the logical address field, so that the more significant row and column address bits (which are needed for the higher-density memories of later generations) are added onto one end of the address word format. Thus, the presence or absence of these bits does not disturb the initial allocation of the minimum set of the address bits into row and column address bits.

The presently preferred embodiment provides a DRAM controller which can be directly connected, without any automatic or selected reconfiguration, to DRAMs of various sizes. This is accomplished by remapping the externally-received address bits, so that the most significant two bits of address are remapped onto the most significant bit of a row address and the most significant bit of a column address. Similarly, the next two most significant bits of address are remapped onto the second most significant row bit and the second most significant column bit. This remapping does not affect the system interface, since the address bit remapping only affects the physical location of the memory cell corresponding to a given logical address, but does not change the characteristics of the logical address space as a whole. Thus, the external system can ignore the actual physical organization of the addressed cells.

The address bit remapping permits memories of any one of four generations to be directly connected to the controller chip of the presently preferred embodiment. For example, the controller chip of the preferred embodiment can be directly connected to memory chips of 256K, 1 megabit (1M), 4M, or 16M. By extending the disclosed innovative ideas, other densities (higher or lower) can be accommodated, or more or fewer than four densities can be accommodated.

Some form of address remapping appears to be disclosed in U.S. Pat. No. 4,675,808 to Grinn et al., which is hereby incorporated by reference. However, the scheme disclosed in the Grinn et al. patent apparently requires one more address line than would be required for the largest addressable memory size. The teaching of the Grinn et al. patent is thus believed to be significantly different from that disclosed herein.

Making DRAMs Nonvolatile

A significant development in system architectures during the 1980s has been the use of nonvolatized semiconductor memory. For example, many systems currently use SRAMs which are combined with a small battery, so that the data in the memories is not lost if the system power is interrupted.

SRAMs (static random access memories), like DRAMs, are volatile. That is, SRAMs too will lose their data as soon as power is interrupted. However, a relatively recent development has permitted systems using SRAMs to achieve nonvolatility. The Smart-Socket (TM), marketed by Dallas Semiconductor Corporation, is a socket which includes a small lithium battery and a controller circuit, so that a CMOS SRAM can be maintained in standby status when the system power supply fails. This product has proven to be extremely useful to system designers.

DRAMs, unlike SRAMs, do not have a very low power standby mode, and do require refresh operations. These factors make it more difficult to implement battery backup for DRAM memory. Another difficulty is that DRAMs tend to be more sensitive to power supply voltage fluctuations than SRAMs are.

The present invention is most preferably used for memory subsystems where standard commercial DRAMs can be used, but wherein the data in the DRAMs is nonvolatized, i.e. is safeguarded against power failure. A controller for making DRAMs appear nonvolatile is disclosed in commonly owned application 248,865, filed Sep. 23, 1988, which is hereby incorporated by reference.

Serial Access to DRAMs

From the system designer's point of view, serial access has many distinctive features which will continue to make it advantageous for some applications. Serial access can provide a robust, well-understood data interface, with great flexibility in system configuration, at the cost (normally) of some limitation in maximum data rate.

The disclosed preferred embodiment provides a DRAM controller which "serializes" and "nonvolatizes" a bank of DRAMs, while providing multigeneration flexibility and refresh control which is totally transparent to the system.

A quite differently motivated approach to the questions of serial access to DRAMs can be found in the video DRAM art generally, and also in publications such as U.S. Pat. No. 4,847,809 ("Image memory having standard dynamic RAM chips"), which is hereby incorporated by reference. It should be noted, however, that the high-speed serial access used in video DRAMs offers significantly different issues from the serial access provided by the present invention. The motivation for serial access in video memories is usually the need to read out an image frame in real-time, at full video data rates (typically 10–50 MHz).

Refresh Timing Control in a Serial-Access DRAM

In the preferred chip embodiment, many aspects of the refresh control and battery backup functions are generally similar to those described in U.S. Pat. application No. 248,865, filed Sep. 23, 1988, which is hereby incorporated by reference. However, the presently preferred embodiment contains additional features, related to the control of refresh timing in a DRAM module which is serially accessed, which are believed to be novel.

In the presently preferred embodiment, the serial overhead protocol provides for burst read and burst write modes, in addition to the normal read and write modes. When the chip is operating in a burst mode, every clock will produce a new memory access (read or write). To escape the burst access modes, the reset line (RST) is pulled high.

An on-chip tapped delay line is used to provide refresh timing. Since refresh timing is typically not very critical, the precision of this delay line is not critical. Trimming of the delay elements can be done on a wafer-by-wafer basis or not at all.

The refresh requirements of a serial access DRAM controller differ somewhat from those of a conventional DRAM system architecture. It is most preferable that the refresh operations be interleaved with user memory access, so that user memory access is not impeded by delays for refresh operations unless absolutely necessary.

One scheme which might be considered is to do the refreshes on the high clock cycle, and then data accesses on the low state of the clock. However, this implies an inconvenient limit on the user's frequency of access while the memory is active: the user would have to perform enough accesses (e.g. more than 512) within the refresh interval (e.g. every 8 milliseconds) to maintain the memory cells in a refresh condition while the chip is active.

The presently preferred embodiment avoids such constraints, at the cost of adding some pipelining functionality to architecture. Each falling edge of the clock line CLK is followed by a refresh cycle, and every rising edge of CLK is followed by an active cycle. Since the clock cycles are allowed to have variable duration, a rising edge may not be followed immediately by a falling edge, and a falling edge may not be followed immediately by a rising edge. To prevent sensitivity to such variable clock circumstances, any falling edge which is not immediately followed by a rising edge will permit multiple refresh cycles to occur. Similarly, any rising edge after which the clock line remains high for more than one clock period will initially be followed by an active cycle, which is then followed by one or more refresh cycles, until the clock line goes low and then goes high again.

Thus, this simple organization allows the active cycles to always have priority, but all remaining time is filled with refresh cycles. Thus, the memory can stay maximally refreshed, without any interference with data access operations under normal conditions. Note that the rising edge of the clock loads a pipeline internal register with the data needed for the ensuing active cycle. In the presently preferred embodiment, the DRAM controller chip is operated at a maximum clock rate of 1 MHz. Of course, a wide variety of clock rates can be used instead, including slower or (more preferably) faster clock rates.

In the presently preferred embodiment, the refresh operations are in fact performed as burst refresh operations, rather than continous refresh operations. This helps to save power and minimize heat dissipation: a 1M DRAM in continuous refresh will typically draw around 70 milliamps of current. If the reset line RST* is brought high during a refresh cycle while the chip is in standby mode, then part of the refresh burst will be stretched.

When power fails, it would be simplest to initiate refresh as soon as possible. However, the risk is that the chip may have been in the middle of a data access. The presently preferred embodiment avoids this risk, by allowing any refresh cycle in progress to be completed before an active cycle is allowed to begin.

In this embodiment, each cycle is identified as a refresh cycle, an active cycle, or an idle cycle. A state machine circuit is used to implement this: at the start of a new cycle, the state machine determines the cycle type and drives appropriate lines.

System Embodiments

One innovative system embodiment, using the disclosed innovative memory controller, is a voice recording storage module. In such a module, a serialized DRAM memory (including a controller as described below and one or more DRAM chips) is combined on a SIP module with a battery and voice compression hardware (such as the DS2167 ADPCM chip from Dallas Semiconductor), together with another controller which controls the data interface functions.

A further advantageous system application of the disclosed memory controller is a new type of disk emulation. The "RAM disks" presently available perform disk emulation in software (using memory which has a largely conventional hardware architecture). By contrast, a block of serialized DRAM according to the present invention can be used to provide a hard-disk-emulating solid-state memory which is, insofar as seen by the interface to the system, a perfect match for the characteristics of a hard disk, except that such a emulator can be made much faster than a hard disk and much more rugged.

BRIEF DESCRIPTION OF THE DRAWING

The present invention will be described with reference to the accompanying drawings, which show important sample embodiments of the invention and which are incorporated in the specification hereof by reference, wherein:

FIG. 1 shows an overall block diagram of the integrated circuit of the presently preferred embodiment.

FIG. 2 schematically shows the serial port protocol of the presently preferred embodiment.

FIG. 4 is a timing diagram, showing timing relations in a refresh cycle.

DESCRIPTION OF THE PREFERRED EMBODIMENTS

Figure 3:
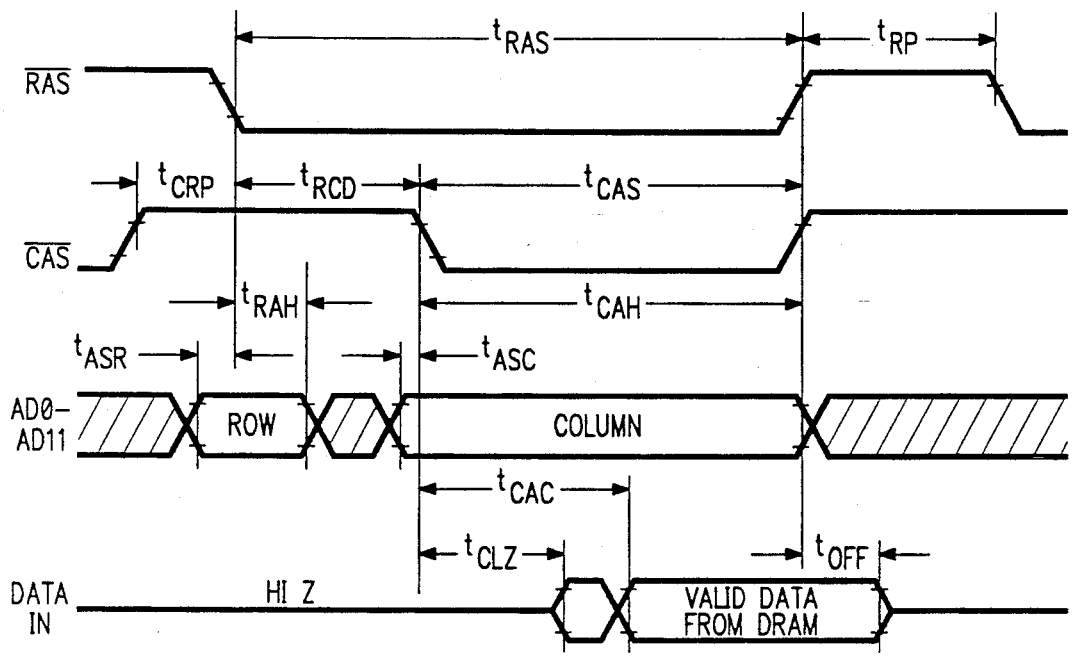
FIG. 3 is a timing diagram, showing timing relations when data is read from the DRAM.
Figure 5:
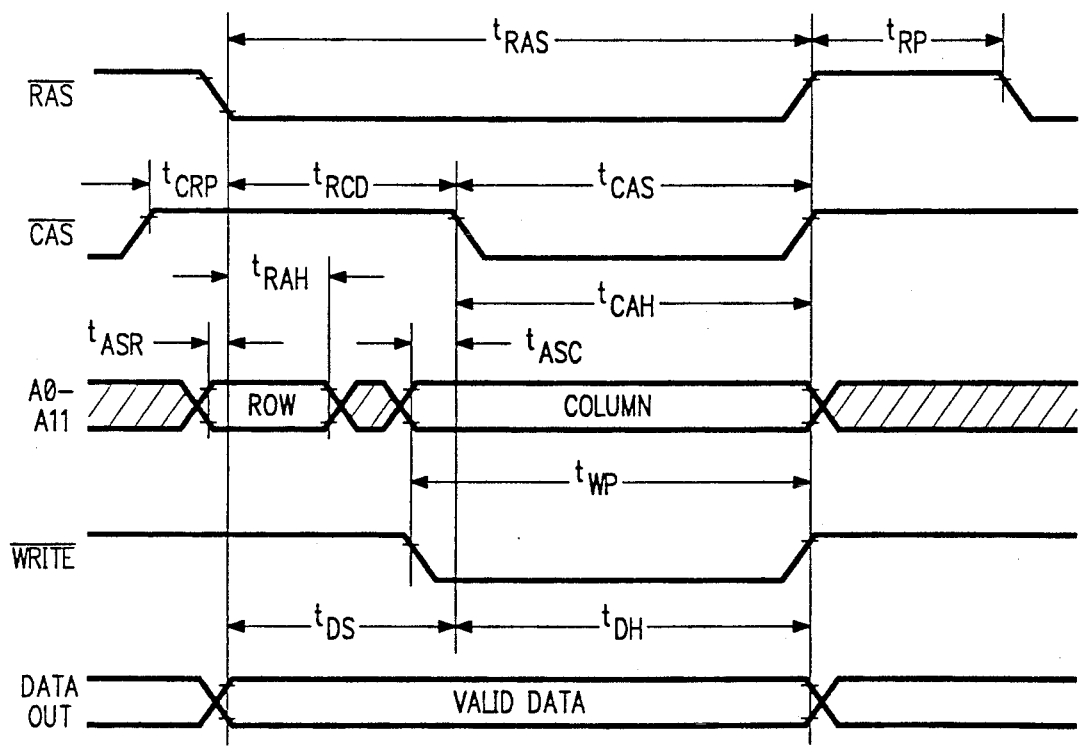
FIG. 5 is a timing diagram, showing timing relations when data is written to the DRAM.
Figure 6:
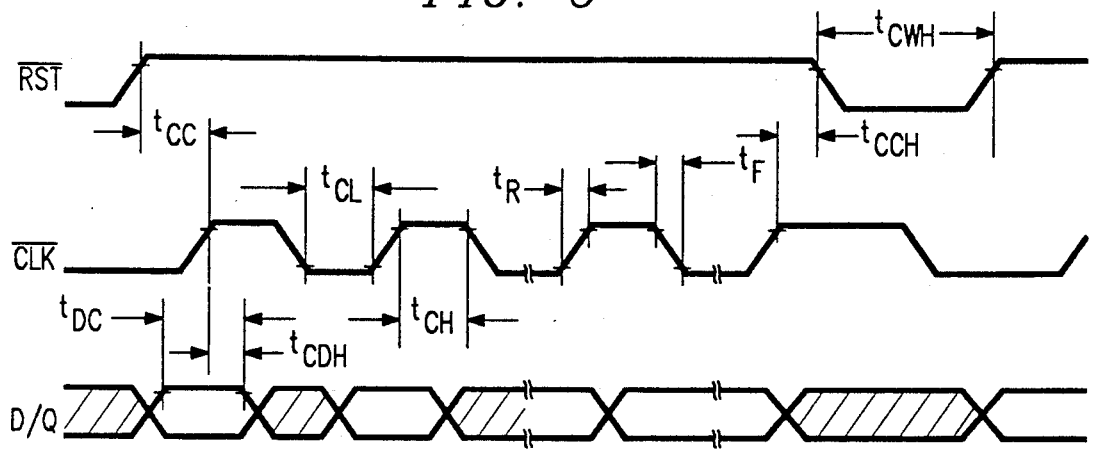
FIG. 6 is a timing diagram, showing timing relations when write data is received at the serial port.
Figure 7:
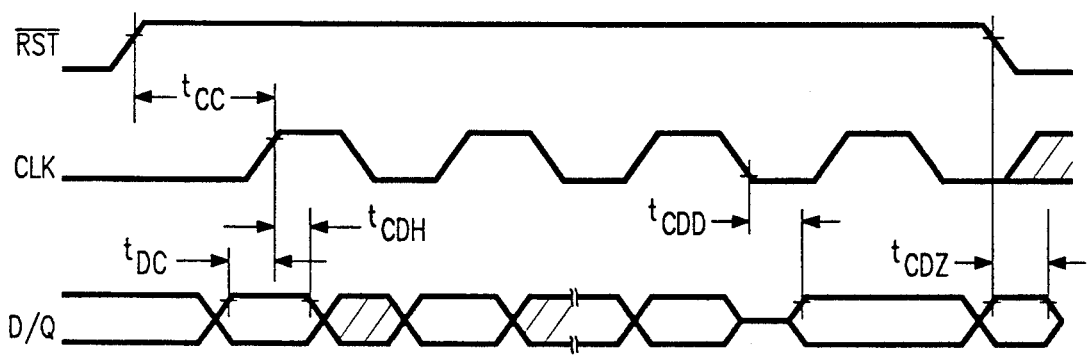
FIG. 7 is a timing diagram, showing timing relations when read data is transmitted at the serial port.
Figure 8:
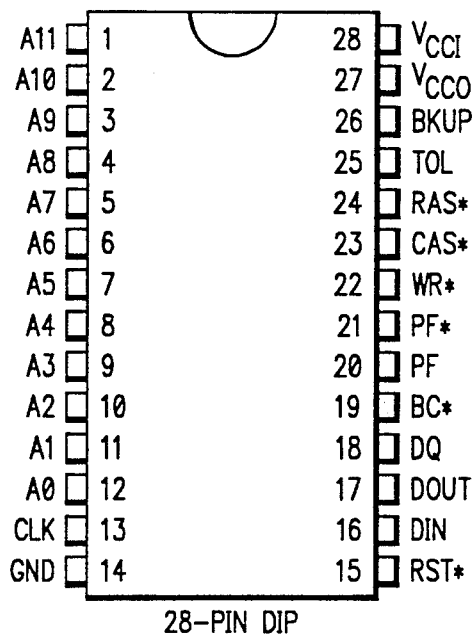
FIG. 8 shows the pinout of the integrated circuit of the presently preferred embodiment.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overall Description

The controller chip of the preferred embodiment serial NV DRAM interface receives serial data transmissions (over a standard 3-wire serial port), and provides data for storage or retrieval from a dynamic random access memory. The controller chip also manages the DRAM's overhead needs; refreshing the DRAM is totally transparent to the serial port. In addition, the controller chip of the preferred embodiment performs all of the power switching and refresh duties necessary to make the DRAM retain data when the primary power supply fails. The backup supply input accepts a wide voltage supply range suitable for use with rechargeable batteries. The controller chip of the preferred embodiment also provides sophisticated measurement circuitry which can predict and measure the condition of the backup supply.

Pin Names

The pin and signal names used in the presently preferred embodiment are as follows:

| PIN NAMES | |
|---|---|
| A0-A11 | Address Outputs to DRAM |
| DIN | Data In from DRAM |
| DOUT | Data Out to DRAM |
| WR* | Write Signal to DRAM |
| RAS* | Row Address Strobe for DRAM |
| CAS* | Column Address Strobe for DRAM |
| $V_{CCI}$ | +5 V Primary Supply Input |
| $V_{CCO}$ | $V_{CC}$ Output to DRAM |
| CLK | Serial Port Clock Input |
| RST | Serial Port Reset Input |
| D/Q | Serial Port Data I/O pin |
| BKUP | Backup Supply Input |
| TOL | 5% of 10% $V_{CCI}$ Supply Tolerance |
| BC* | Backup Supply Fail Flag |
| PF, PF* | $V_{CCI}$ Fail Flags |
| GND | Ground |

Operation-Serial Port Interface

The only timing requirements on the serial port side (RST, DQ, CLK) is that the CLK be within DC to 1 MHz (50% duty cycle). The controller chip of the preferred embodiment will perform proper refreshing even when the CLK cycles are as slow as DC, and CLK can be stretched as desired, as long as the 1 MHz frequency limit is not exceeded and minimum pulse width (high or low) are met.

The main elements of the controller chip of the preferred embodiment is shown in FIG. 1, as shown, three signals enter or retrieve data from a three wire converter. The signals CLK, RST and D/Q comprise a three wire serial port. To transfer data into the controller chip of the preferred embodiment RST is first driven high while CLK is low. After sufficient setup time from RST one bit of data is placed onto the D/Q line. With valid data on D/A the CLK line is then transition low to high. The CLK transitions causes the first bit of data to be assembled into the three wire converter. Since the serial port can only accept data one bit at a time, address information must always be sent first to inform the three wire converter of the destination of data which will follow. Address information is always entered starting with the least significant bit of the logical address field and ending with the most significant bit of the address field. Twenty-four bits are always written to the three wire converter to form the address or starting address regardless of the RAM being used (FIG. 2). After the 24 bit address field is sent, an eight bit function code is written which instructs the three wire converter of the action to be taken on data which will follow. The function codes are listed in Table 1.

TABLE 1

| Function Codes | |
|---|---|
| FUNCTION NAME | FUNCTION CODE (HEX) |
| BURST READ DRAM DATA | 00 |
| READ DRAM DATA | 01 |
| READ BKUP COUNTER | 02 |
| WRITE BKUP COUNTER | 03 |
| REFRESH PERIOD = 4 MSEC | 04 |
| REFRESH PERIOD = 8 MSEC | 05 |
| REFRESH PERIOD = 16 MSEC | 06 |
| REFRESH PERIOD = 32 MSEC | 07 |
| BACKUP SUPPLY ENABLED | 0C |
| BACKUP SUPPLY DISABLED | 0D |
| WRITE DRAM DATA | 0E |
| BURST WRITE DRAM DATA | 0F, FF |

After a function code has been correctly entered, one or more data bits can be written or read from RAM or the control registers within the battery backup control unit. Function codes which have no definition or those which control the backup supply or refresh period cause further data transfer to terminate until RST is driven low and then high again to begin a new cycle.

Data is always written in the same manner as the address and function code. Data is read by driving the clock low while RST is high. Data will become valid on the DQ line after sufficient time is allowed for access. The read cycle is terminated when CLK is returned high. (All transfer of address, data, or function codes are terminated when RST is driven low.)

DRAM Refresh Control

Refresh burst cycles are always sent to the attached DRAM regardless of activity on the serial port. When a proper DRAM read/write access code has been entered at the serial port, a normal DRAM read or write cycle will be interlaced with the refresh burst cycles. When $V_{CCI}$ goes to an out-of-tolerance condition ($V_{CC}<4.75$ volts with TOL grounded or $V_{CC}<4.5$ volts when TOL is connected to $V_{CCO}$), the chip of the preferred embodiment sends out 256 refresh cycles for each refresh period which is selected by the user (4, 8, 16, or 32 msec). The 256 refresh cycles occur at a 500 ns rate for about 128 us. All refresh cycles are the CAS-before-RAS type and are sufficiently long to meet the refresh requirements of most DRAM densities. After refresh, the chip of the preferred embodiment remains quiet for the remainder of the refresh period to conserve power, except for DRAM read or write cycles initiated by the serial port.

Burst Mode

When it is necessary to retrieve or write multiple consecutive bits of data from the DRAM, burst read or burst write function codes can be used. In this mode, the starting memory address is entered in the address field the address field is then increment for each new clock cycle. While low density DRAMS do not require the entire 24 bit address field, 24 bits must be always entered the upper bits (when not needed) are ignored. The controller chip produces the appropriate RAS and CAS address. Burst mode is terminated when RST is driven low. Each clock cycle, for burst read or burst write, produces a single bit transfer.

DRAM Timing-Read Cycle

A read cycle is started when the row address are asserted valid on the address output pins of the controller chip of the preferred embodiment (A0-A11). After sufficient setup time, the RAS signal is asserted, and the row addresses are then latched into the DRAM. Next the column address are asserted valid and after setup time the column address strobe goes active latching the column address. The CAS strobe will stay low for a sufficient time for valid data to be output and received from the DRAM. The cycle is terminated when both RAS and CAS are returned high and the out pin is returned to a high impedance state. The write signal is always high during read cycles.

DRAM Timing-Write Cycle

A write cycle is started when the row addresses are asserted valid in the address output pins of the controller chip of the preferred embodiment (A0-A11). After sufficient setup time, the RAS signal is asserted and the row addresses are latched into the DRAM. At the same time, valid data is placed on the data output pin. Next the write signal is asserted low, and at the same time the column address is asserted valid on the address bus. After setup time the column address is asserted low.

All signals (RAS, CAS, A0-A11, Write, and DATA-OUT) remain active and valid until the write cycle is complete. the cycle is terminated when RAS, CAS and Write are driven back high and the date and address bus returns to a high impedance state.

Refresh Period Function Codes

The refresh period can be selected to be 4 ms, 8 ms, 16 ms or 32 ms, with 256 burst refresh cycles during each period. This change would still meet all refresh periods and make it compatible with 256K DRAMS which has 256 cycles in a 4 ms period.

Three function codes are used to set the refresh period for the attached DRAM. All refresh periods contain 256 cycles. As such most DRAMS would use 4 ms refresh per 256 cycles regardless of the density of the RAM attached. For example, a 1M DRAM requires 512 cycles in 8 ms, while a 4M DRAM requires 1024 cycles in a 16 ms period. Both devices are satisfied using 4 ms refresh, as refresh of the 4M RAM is satisfied in four refresh periods. However, extended refresh periods can be used in cases where DRAMs have been screened or treated for longer data retention between refreshes.

Whenever a function code is written to select the refresh period, the logical address field has no importance and can be set to any value. However, 24 bit entry must always recede the entry of a function code. All function codes which control backup supply, refresh density, or any undefined function codes, will not allow data to be forwarded to a connected RAM. Data sent through the serial port after one of these function codes is sent will be ignored until RST is driven low and then high again to begin a new cycle. Function codes for backup supply control and refresh periods need only be written once as long as either the backup supply or the primary supply ($V_{cc}$) remain within data sheet limits.

Operation-Power Loss and Data Retention

When the 5 volt $V_{CCI}$ power begins to drop, a precision band gap reference and comparator senses this change. Depending on the level of the tolerance pin TOL, a power fail signal will be generated as $V_{CCI}$ falls below 4.75 volts or 4.5 volts. The power fail signals are driven active at this time and will remain active until $V_{CCI}$ is restored to normal conditions. When the data retention mode is turned on, the controller chip of the preferred embodiment isolated the three wire serial port, tristates the address outputs and starts driving RAS, CAS, and the WE outputs. The $V_{CCI}$ input is disconnected from the $V_{CCO}$ output and the backup supply is connected. THe backup supply input is normally connected to either a chargeable capacitor or to a battery. However, any backup supply with a voltage output between the limits of (e.g.) 6 Volts and 10 Volts is suitable.

A burst of CAS before RAS refresh cycles is generated at a cycle time of 500 ns maximum. This burst refresh continues for 256 cycles. After the burst refresh is complete, subsequent burst refreshing continues at intervals determined by the refresh period function code written. If a refresh function code is not written, the default is 4 ms refresh until $V_{CCI}$ returns to normal levels.

Battery Condition

The controller chip of the preferred embodiment contains two features which provide information about the condition of the backup supply.

First, the controller chip of the preferred embodiment monitors the backup supply input condition. If this input is below $V_{CCI}$, the backup condition output pin (BC) is driven to its active state (low) and will remain in this state until the backup supply voltage is restored to a level above $V_{CCI}$. This feature is active only while $V_{CCI}$ is applied within nominal limits. Whenever the backup supply is applying power, the BC pin remains in a high impedance state.

The second feature for monitoring the condition of the backup supply is a counter which is decremented on one second intervals whenever the backup supply is supplying power. This counter is set with a number while $V_{CCI}$ is within normal limits. The value of the counter is set by entering the desired binary value in the logical address field, followed by a write-battery-condition function code. The value is entered starting with the LSB of the address field and ending with the MSB of the address field after the function code is correctly entered. Information in the address field is automatically entered into the battery condition counter when reset is brought low to end the cycle. The battery condition counter value can only be entered when $V_{CCI}$ is within normal limits and no other action will take place when using the write-battery-condition function code.

The battery condition counter can be read by loading the address field with any value followed by the read-battery-condition function code. After this function code is correctly entered, the next 24 clock cycles will output the value of the battery condition counter on the DQ line. The value of the battery condition counter can only be read when $V_{CCI}$ is within normal limits and no other action will take place when a read backup condition function code is used. The backup condition counter is a binary number representing the time allowed until the backup supply has been discharged. When the counter reaches zero, the BC pin will be as soon as $V_{CCI}$ is within normal limits. The BC pin will remain low until a new value is written into the battery condition counter. The correct value to enter into the counter can be calculated by dividing the capacity in milliAmpere-hours of the backup supply by the average load current of the DRAM, and converting this value into seconds.

Conservation of the Backup Supply

Two other function codes are used to control a switch which allows conservation of the backup supply when data retention is not required. That is, the battery-backed functionality can be disabled if desired. For example, if a supervising process knows that one (hardware) block of memory contains no important data, it may be useful for the process to disable the battery backup functionality of that block of memory. This can provide a greater longevity for the battery backup capability.

This switch can be turned on or off by entering any value in the address field followed by the function codes for turning off or on the backup supply. The bit patterns are shown in Table 1. The backup supply switch can only be set when $V_{CCI}$ is within normal limits and no other action will take place when using these function codes.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested in this application are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly their scope is not limited except by the allowed claims.

What is claimed is:

1. A dynamic memory controller, comprising:
   (a) a reset input terminal;
   (b) a clock input terminal;
   (c) a bidirectional serial terminal;
   (d) dynamic memory refresh control signal output terminals;
   (e) a bidirectional dynamic memory data port selectively coupled to said serial terminal;
   (f) a refresh time period selector, said selector accessed by joint signals on said reset, clock, and serial terminals;
   (g) refresh signal generating circuitry coupled to said clock input terminal and said refresh control signal output terminals, said circuitry generating refresh dynamic memory refresh signals at said output terminals for a refresh time period when a signal at said clock input terminal switches from a first state to a second state, said generating further refresh control signals at said output terminals when said signal at said clock remains in said second state.

* * * * *